United States Patent
Pan et al.

(10) Patent No.: US 6,177,901 B1
(45) Date of Patent: Jan. 23, 2001

(54) HIGH ACCURACY, HIGH SPEED, LOW POWER ANALOG-TO-DIGITAL CONVERSION METHOD AND CIRCUIT

(76) Inventors: Li Pan; Yi Pan, both of 4505 SW. 142nd Ave., Apt. 33, Beaverton, OR (US) 97005

( * ) Notice: Under 35 U.S.C. 154(b), the term of this patent shall be extended for 0 days.

(21) Appl. No.: 09/243,897

(22) Filed: Feb. 3, 1999

(51) Int. Cl.[7] ............................................. H03M 1/50
(52) U.S. Cl. ................................... 341/166; 341/155
(58) Field of Search ............................. 341/166, 158, 341/163, 122, 118, 155, 172, 169, 152, 157; 327/96, 69

(56) References Cited

U.S. PATENT DOCUMENTS

| | | | |
|---|---|---|---|
| Re. 34,428 | 11/1993 | George et al. | 341/118 |
| 3,609,756 | * 9/1971 | Murrell et al. | 341/157 |
| 3,737,897 | 6/1973 | Cuthbert et al. | 341/155 |
| 3,943,466 | * 3/1976 | Lyghounis | 341/170 |
| 4,152,698 | * 5/1979 | Van Deursen | 341/169 |
| 4,176,314 | * 11/1979 | Yamada | 327/69 |
| 4,716,292 | * 12/1987 | Rieder et al. | 341/152 |
| 4,839,652 | * 6/1989 | O'Donnell et al. | 341/122 |
| 4,998,109 | 3/1991 | LeChevalier | 341/166 |
| 5,138,552 | * 8/1992 | Weedon et al. | 341/157 |
| 5,204,678 | 4/1993 | Foley | 341/152 |
| 5,298,902 | 3/1994 | Kogan | 341/157 |
| 5,321,404 | 6/1994 | Mallinson et al. | 341/169 |
| 5,424,738 | 6/1995 | Barroue et al. | 341/118 |
| 5,592,168 | 1/1997 | Liao | 341/167 |
| 5,614,902 | 3/1997 | Hopkins | 341/118 |
| 5,623,220 | 4/1997 | Betti et al. | 327/79 |
| 5,638,072 | 6/1997 | Van Auken et al. | 341/141 |
| 5,835,050 | 11/1998 | Roberts | 341/172 |
| 6,031,399 | * 2/2000 | Vu et al. | 327/96 |

\* cited by examiner

*Primary Examiner*—Howard L. Williams
*Assistant Examiner*—Jean Bruner Jeanglaude (57) ABSTRACT

A high accuracy, high speed, low power analog-to-digital conversion method and circuit. An input signal is sampled and the sample is compared to a scan signal whose amplitude varies with time. A time-to-digital conversion of the sample is obtained. At least two reference signals are also provided which are compared to the scan signal. Time-to-digital conversions of the reference signals are also obtained. The digital value of the sample is determined with reference to the known mathematical description of the scan signal, the time-to-digital conversions and the reference signals. The method and circuit may be employed in stages, where in a first stage, the most significant bits are determined and in a second stage, the least significant bits are determined.

27 Claims, 8 Drawing Sheets

HIGH ACCURACY, HIGH SPEED, LOW POWER ANALOG-TO-DIGITAL CONVERSION METHOD AND CIRCUIT

BACKGROUND OF THE INVENTION

This invention relates to a method and apparatus for analog-to-digital conversion. More particularly, the invention relates to a high accuracy, high speed, low power analog-to-digital conversion method and circuit.

The importance of high accuracy and speed, as well as low power consumption in an analog-to-digital converter ("ADC") is well known. This need is especially great in CMOS circuitry, where it is desirable to integrate ADC circuits with digital circuits on the same substrate. While some efforts have been made to integrate ADC circuits with digital circuits on the same CMOS substrate, the technology thus far has had serious drawbacks. Flash ADCs, discussed below, have been used to achieve high speed digital-to-analog conversion on a CMOS digital substrate, but suffer from mismatch errors, among other things. Pipeline ADC's, wherein high speed is achieved by using multiple segmented stages require linear capacitors that are difficult and expensive to realize.

There are several basic approaches to analog-to-digital conversion, and many variations thereof. One approach, known as charge integration conversion, works by sampling the analog signal, charging a capacitor with the sample, then discharging the capacitor at a known rate while counting the time it takes to discharge. The time is proportional to the sampled voltage. This approach is disclosed in LeChevalier U.S. Pat. No. 4,998,109 ("LeChevalier") and Kogan U.S. Pat. No. 5,298,902. A more sophisticated variation of this approach, known as dual-slope conversion, charges a capacitor for a known, controlled period of time before discharging the capacitor at a constant rate. Examples of this approach are disclosed in Hopkins U.S. Pat. No. 5,614,902; Liao U.S. Pat. No. 5,592,168; and George et al. U.S. Pat. No. Re. 34,428. While these methods can be very accurate, they are also relatively slow because the average time required is proportional to the number of levels the converter must resolve.

Another approach, similar to the charge integration approach, works by comparing a sample of the input signal to a reference signal whose amplitude varies with time in a known way, typically a ramp with a constant slope, and counting the time until the level of the reference signal is substantially equal to the level of the sample. That time is proportional to the level of the sample. Examples of this approach are disclosed in Cuthbert et al. U.S. Pat. No. 3,737,897 and Mallinson et al. U.S. Pat. No. 5,321,404. Like the charge integration approach, this "slope comparison" approach can produce very accurate results but is relatively slow. In addition, this approach has the drawback that it is susceptible to drift with temperature variations which change the manner in which the reference signal varies with time, such as by changing the slope of a ramp reference.

High speed analog-to-digital conversion can generally be achieved by an approach known as flash conversion. In this approach a plurality of comparators simultaneously compare the analog signal to each of the voltage levels to be resolved. This approach is described in LeChevalier. Some drawbacks of flash conversion are that it requires a large number of comparators which are expensive and increasingly impractical with increasing resolution, and that one analog signal drives many comparators, so expensive buffering is required to provide the necessary power.

A compromise on speed can be achieved using a successive approximation approach. In this approach, the analog signal is sampled and the sample is compared sequentially to successively closer values using a single comparator. An example of successive approximation is disclosed in Van Auken et al. U.S. Pat. No. 5,638,072. Successive approximation requires less circuitry and is faster than charge integration for the same resolution, but is much slower than flash conversion.

It would be desirable to employ an analog-to-digital conversion approach that achieves accuracy comparable to charge integration, without the drift problem of slope comparison, and achieves speed comparable to flash conversion.

In addition, all of the known approaches to digital-to-analog conversion employ comparators, which have inherent offset that introduces error. It would be desirable to substantially eliminate that error with minimal additional circuitry, particularly for integration with CMOS digital technology.

Accordingly, there is a need for a high accuracy, high speed, low power analog-to-digital conversion method and circuit.

SUMMARY OF THE INVENTION

The present invention solves the aforementioned problems and meets the aforementioned needs by (1) providing for simultaneous comparisons of a plurality of signal samples with a time varying scan signal, (2) sampling and converting references voltages as well as signal samples, (3) splitting the conversions into coarse and fine parts, and (4) canceling out any offset induced error. The input signal samples may be sampled from one analog input signal, or from multiple analog input signals.

Basically, a sample of an input signal which it is desired to convert to digital form has a value $A_{input}$. The scan signal ranges over all the anticipated values of $A_{input}$. The time, $T_{scan}$, when $A_{scan}$ reaches $A_{input}$ is determined. Preferably, such scan times are determined for a plurality of samples $A_{input}(k)$ of the input signal.

Further, at least two reference voltages $V_{ref1}$ and $V_{ref2}$ are compared against the scan signal, and the times $t_{ref1}$ and $t_{ref2}$ where $A_{scan}$ reaches of $V_{ref1}$ and $V_{ref2}$ are determined, and coordinates ($V_{ref1}$, $t_{ref1}$) and ($V_{ref2}$, $t_{ref2}$) are obtained. A sufficient number of coordinates are obtained to fully characterize the scan signal. For example, where the scan signal is linear, two coordinates fully characterize the scan signal.

In another aspect of the invention, a "two-step" conversion is provided. In a first stage or step of the conversion, a coarse determination of $A_{input}$, $A_{coarse}$, is obtained in like manner to that described above, wherein a first set of coordinates sufficient to define the scan signal are selected that approximately bound the full, anticipated input signal range. The coarse determination finds the most significant bits of $A_{input}$.

In a second stage or step of the analog-to-digital conversion, a fine determination of $A_{input}$, $A_{fine}$, is obtained in like manner to that described above; however, a second set of reference values are selected with knowledge of $A_{coarse}$ so that a significantly smaller range may be employed for the scan signal than the entire anticipated signal range.

The two-step method may be performed by a single stage operating in series, or by a plurality of stages forming a pipeline.

In a further aspect of the invention, comparator offset is substantially eliminated by converting the sample twice in consecutive steps. In a first conversion, the input and scan signals are provided to respective inputs that are inverting and non-inverting. In a second conversion, the inputs to the comparator are reversed and output negated. The results of both comparisons are averaged to cancel out comparator input offset.

Accordingly, it is a principal object of the present invention to provide a novel analog-to-digital conversion method and circuit.

It is another object of the present invention to provide such an analog-to-digital conversion method and circuit that provides for higher accuracy, higher speed and more efficient power consumption.

It is still another object of the invention to provide an accurate, high speed analog-to-digital converter circuit that can be integrated into low power CMOS digital circuit substance.

The foregoing and other objects, features and advantages of the invention will be more readily understood upon consideration of the following detailed description of the invention, taken in conjunction with the following drawings.

DETAILED DESCRIPTION OF A PREFERRED EMBODIMENT

Figure 1:
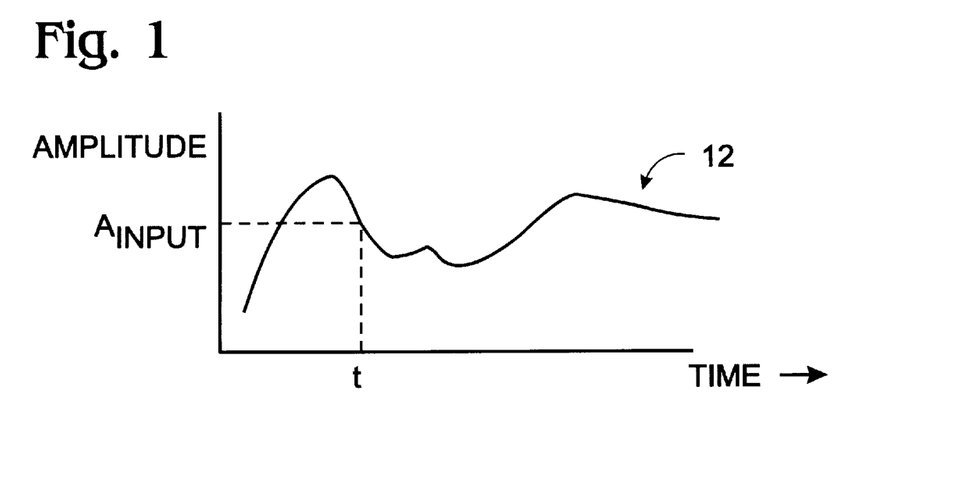
FIG. 1 is a voltage-time plot representing the sampling of an analog input signal.
Figure 2:
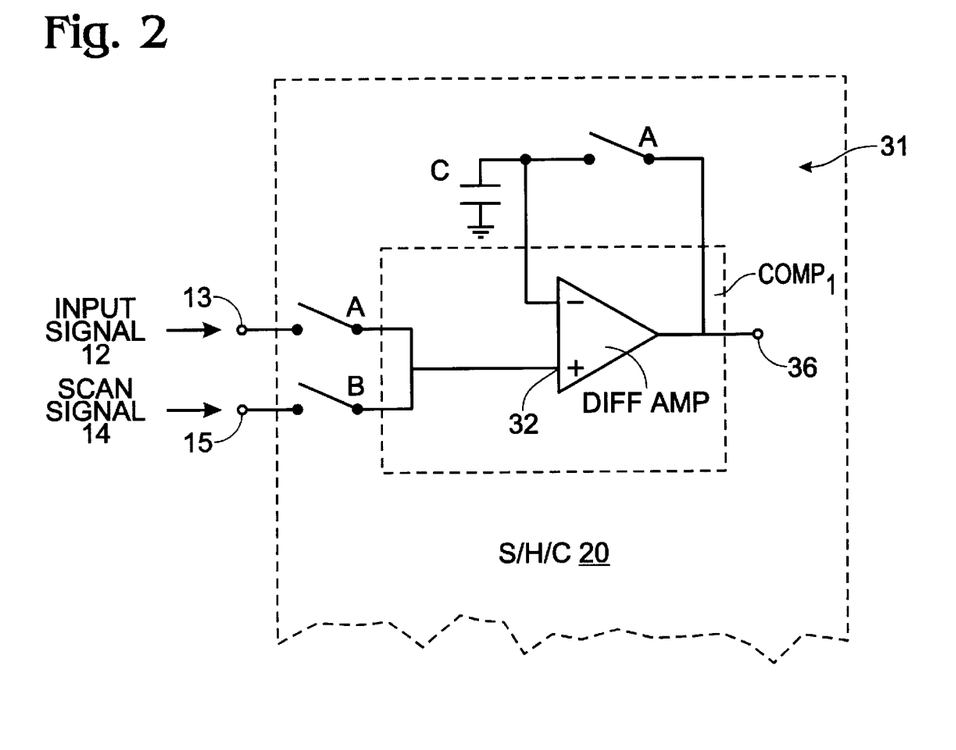
FIG. 2 is a preferred embodiment of a sampling, holding and comparing circuit according to the invention.

Referring to FIG. 1, it is desired to convert an analog input signal 12 into digital form. In a sampling and holding step, a sample $A_{sample}$ of the signal 12 at a time "t" is taken and held. The sample is typically a voltage and this is assumed hereinafter. A circuit 31 for this purpose is shown in FIG. 2. A comparator "$Comp_1$" includes a differential amplifier, "DiffAmp." Access to the non-inverting input 32 of DiffAmp is controlled by two switches, a double throw switch A and a single throw switch B. Switch A couples the input signal 12, provided at the input 13, to the input 32 of DiffAmp. The inverting input of the differential amplifier is coupled to ground by a hold capacitor C. A feedback loop 34 from the output 36 of the differential amplifier to the capacitor C is closed by operation of the switch A. To sample the input signal 12, switch A is closed and switch B is opened. The differential amplifier acts as an amplifier, charging the hold capacitor C to the value $A_{sample}$.

Figure 3:
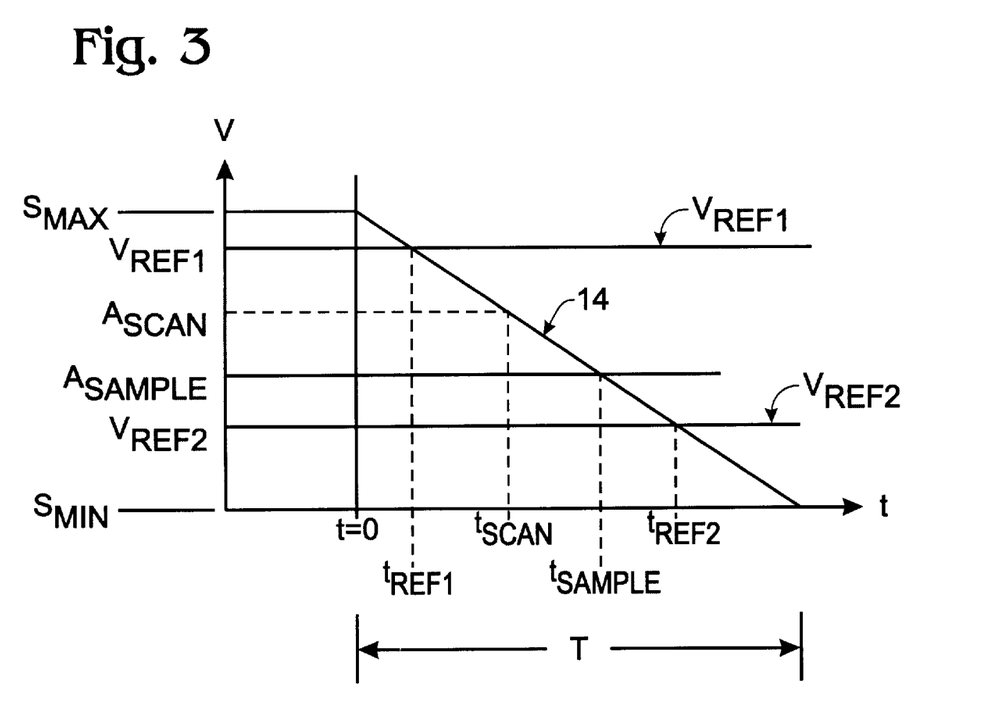
FIG. 3 is a voltage-time plot illustrating a concept for use in a single-step analog-to-digital conversion method according to the present invention.

Turning to FIG. 3, a conversion step is initiated after the sampling step. A scan signal 14 is provided having an amplitude $A_{scan}$ that is a function of time $t_{scan}$. The function illustrated in FIG. 3 is a straight line or ramp function; however, throughout this specification it will be understood that the function may any function of time.

The scan signal is fully characterized by a complete set of coordinates. For a scan signal that is a linear function of time, a complete set of coordinates consists of two coordinates ($V_{ref1}$, $t_{ref1}$) and ($V_{ref2}$, $t_{ref2}$). However, where the scan signal is a higher order function, a complete set will consists of more than two coordinates. $V_{ref1}$ and $V_{ref2}$, which are ordinarily though not necessarily fixed, reference voltages, are referred to herein as "reference signals."

The scan signal scans across a range of the values that $A_{sample}$ could possibly take on over a time interval T. It is preferable to provide constant reference signals $V_{ref1}$ and $V_{ref2}$ over this time interval. It is also generally desirable that the signals $V_{ref1}$, and $V_{ref2}$ are at the ends of the range of the scan signal, or are substantially spaced apart. However, neither of these features is essential to practicing the invention.

As illustrated in FIG. 3, the scan signal is commenced at time t=0 from a maximum value $S_{max}$ and decreases to a minimum value $S_{min}$ at the end of the time interval T. However, the scan signal could commence at any value and change in either direction from that value without departing from the principles of the invention. The times $t_{ref1}$, $t_{ref2}$, and $t_{sample}$ when the scan signal equals the signals $V_{ref1}$, $V_{ref2}$ and $A_{sample}$, respectively, are determined as described below.

Figure 4:
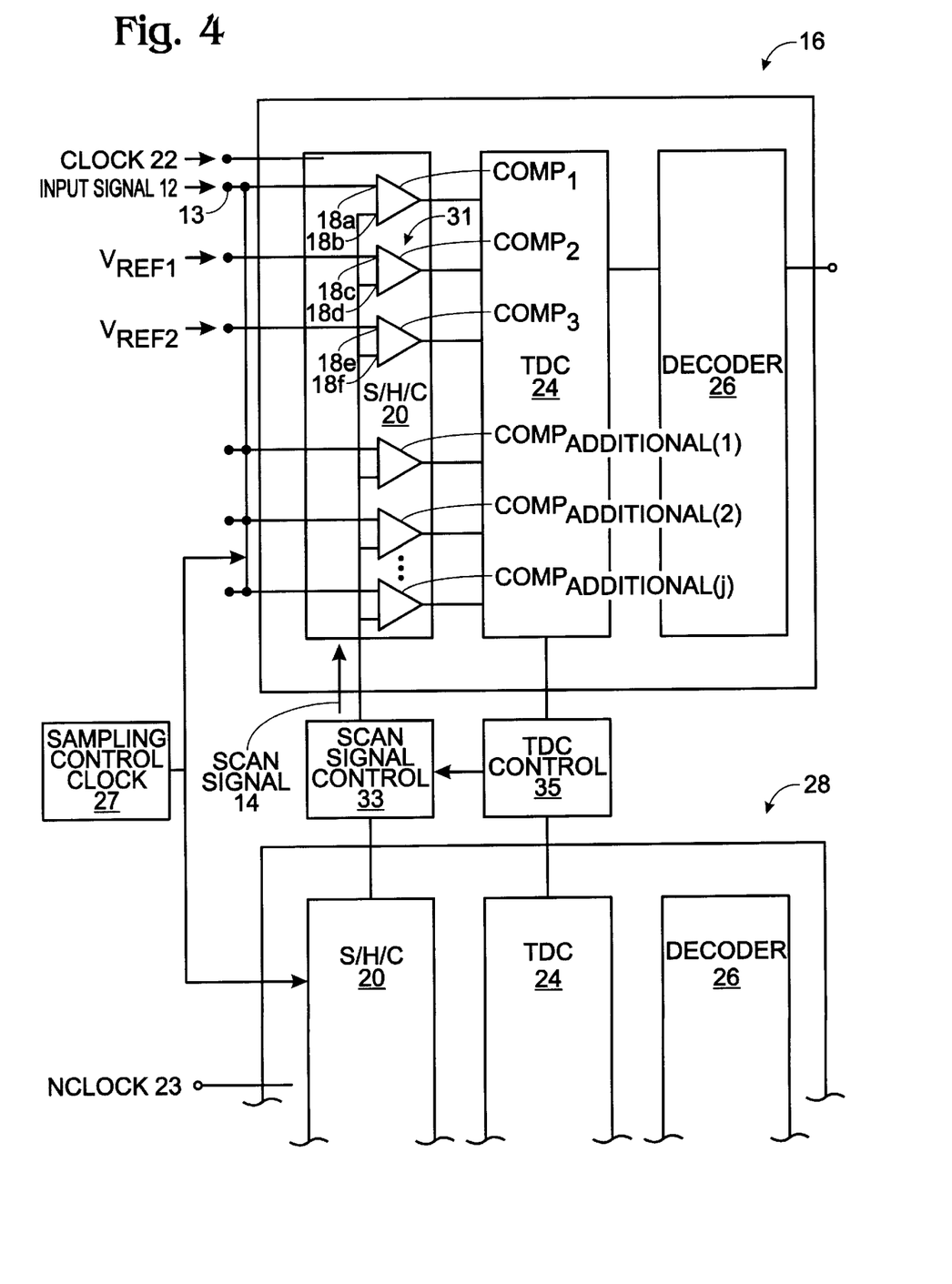
FIG. 4 is a block diagram of a circuit for implementing the conversion of FIG. 3 simultaneously for multiple signal samples.

Referring back to FIG. 2, the circuit 31 is operated as a comparator $Comp_1$, for providing an output when the scan signal 14 equals $A_{sample}$. After the holding capacitor C is charged by $A_{sample}$, switch A is opened and switch B is closed. The feedback loop is opened, and the differential amplifier "Diffamp" compares the voltage held on the capacitor C with the scan signal. Diffamp changes state when the comparison becomes true. Referring to FIG. 4, the circuit 31 is part of a sampling, holding and comparing circuit ("S/H/C") 20. The circuit 20 receives the input signal 12 at an input 13, samples and holds the signal $A_{input}$, and applies this result to a first input 18a of the comparator $Comp_1$. The time-varying scan signal 14 is applied to a second input 18b of the comparator $Comp_1$ in the circuit 20.

As shown in FIG. 4, a number of the circuits 31 are shown in the S/H/C circuit 20. In the circuit 20, comparisons between the scan signal 14 and $V_{ref1}$, at the comparator $Comp_2$, and between the scan signal and $V_{ref2}$, at the comparator $Comp_3$, are performed in parallel with the comparison between the scan signal and $A_{sample}$ at $Comp_1$. Particularly, the reference signal $V_{ref1}$ is applied to a first input 18c of the comparator $Comp_2$. The scan signal 14 is applied to a second input 18d of the comparator $Comp_2$. Similarly, the reference signal $V_{ref2}$ is applied to a first input 18e of the comparator $Comp_3$ and the scan signal is applied to a second input 18f of $Comp_3$.

The output of the comparators is provided to a time to digital converter ("TDC") 24. The TDC begins to count the time when the scan signal 14 begins scanning, and stops counting the time for each comparator when the comparator changes state. The times so counted are converted to digital form, referred to hereinafter as "intermediate digital words". The intermediate digital words are times that are representative of the magnitudes of the signals $V_{ref1}$, $V_{ref2}$, and $A_{sample}$. The TDC 24 is controlled by a TDC control circuit 35, and the scan signal is generated by a scan signal control circuit 33.

The amplitude $A_{sample}$ of the input signal 12 can be seen to be equivalently described in the following ways:

$$A_{sample} = V_{ref1} - (V_{ref1} - V_{ref2}) \cdot (t_{ref1} - t_{sample})/(t_{ref1} - t_{ref2})$$

$$A_{sample} = V_{ref2} + (V_{ref1} - V_{ref2}) \cdot (t_{sample} - t_{ref2})/(t_{ref1} - t_{ref2})$$

Employing these relations and the measured times $t_{sample}$, $t_{ref1}$ and $t_{ref2}$, assuming the signals $V_{ref1}$ and $V_{ref2}$ to be known, the value $A_{sample}$ may be computed. This "normalization" is accomplished in a decoder 26.

The S/H/C circuit 20, the TDC 24 and the decoder 26 all form a basic analog-to-digital converter circuit 16 according to the present invention. It is an outstanding feature of the basic circuit 16 that high accuracy is achieved by normalizing the intermediate digital words with measured representations for a complete set of reference signals. However, additional features providing additional advantages are preferably also included as described below.

The invention is employed to greatest advantage where there are multiple samples of the input signal that are converted in a single step of conversion. This is because the sampling and holding function can be accomplished much faster than the comparing function of the circuit 16, the latter consuming the entire time interval T for scanning. In this regard, it is another aspect of the invention to provide for repeated, sequential sampling of the input signal 12.

Figure 5:
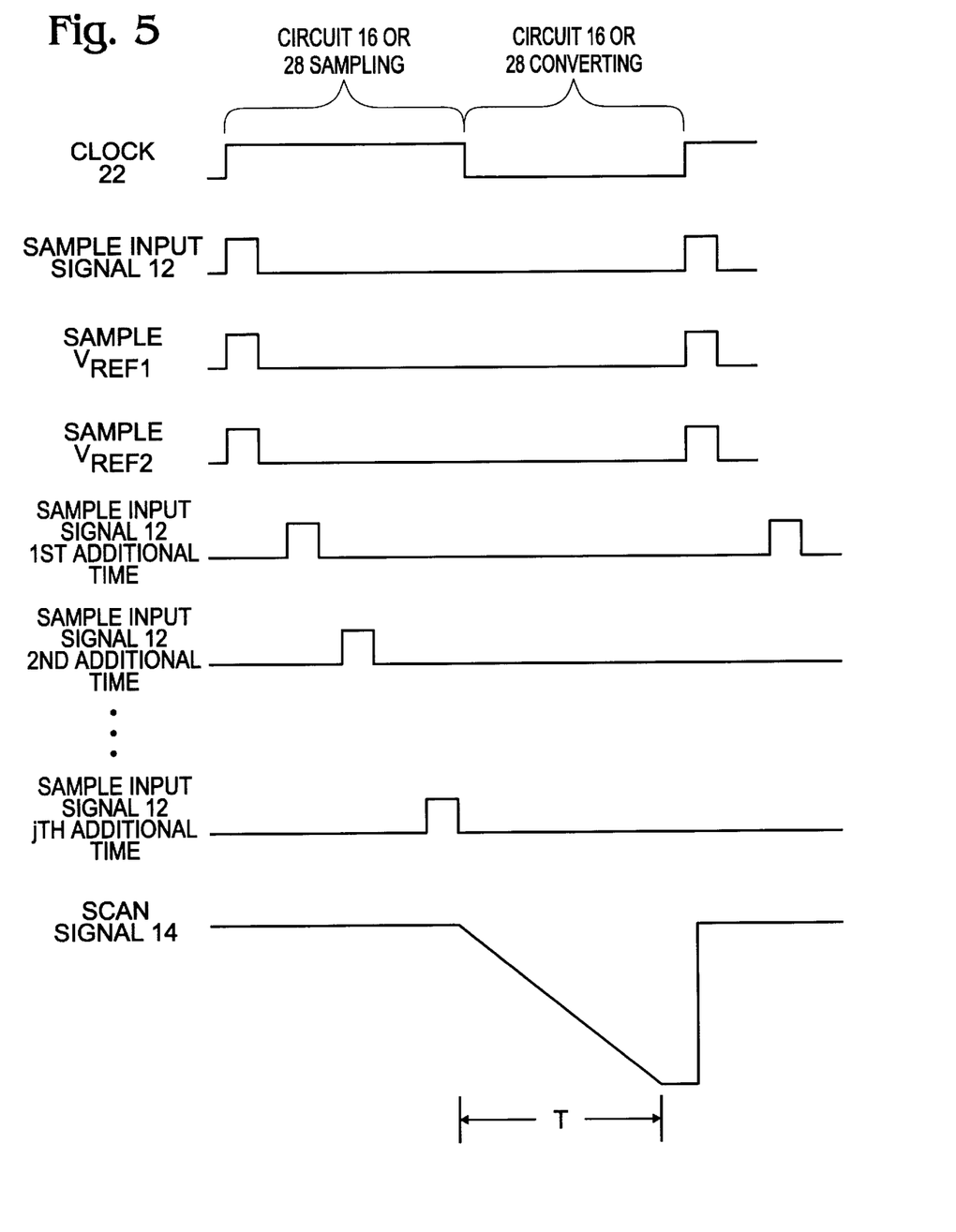
FIG. 5 is a timing diagram for the circuit of FIG. 4, showing a multiple sampling feature of the invention.
Figure 6:
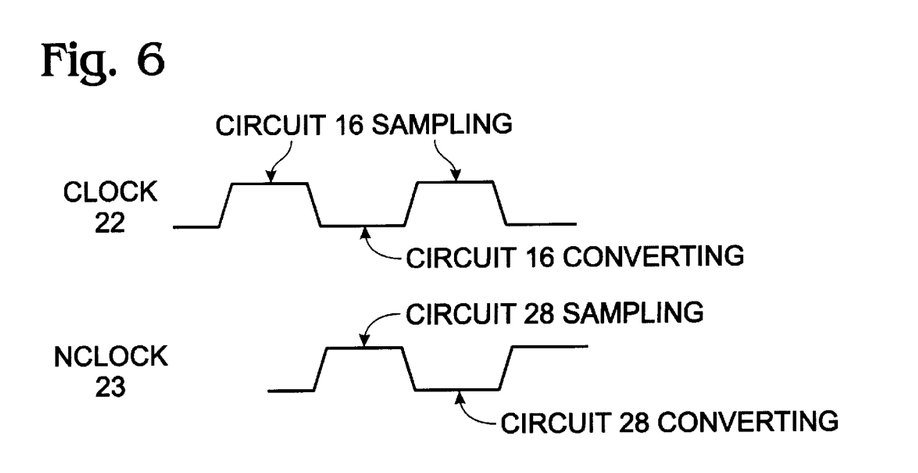
FIG. 6 is a timing diagram for the circuits of FIGS. 2 or 4, showing a continuous conversion aspect of the invention.

Referring to FIGS. 4 and 5, a sampling control clock 27 coordinates the sequential acquisition of an additional "j" samples of the input signal 12, so that j+l=k total samples $A_{input}(k)$ are acquired during a sampling half-cycle of a clock 22. The samples are converted during a second half-cycle of the clock during which the scan signal is active as shown in FIG. 6. For conversion, comparisons are performed in the j additional comparators $Comp_{additional}(1)$, $Comp_{additional}(1)$, to $Comp_{additional}(j)$. To fully realize the advantages of this method, the total time for the sequential sampling preferably equals the time that is required for conversion. With this feature, analog-to-digital conversion is faster than flash conversion for high resolution.

Referring again to FIG. 2 and to FIG. 6, it is preferable to provide a second circuit 28 that essentially reproduces the functions of the circuit 16. The scan signal control circuit 33, the the TDC control circuit 35 and the sampling clock 27 are directly shared between the circuits 16 and 28, and the logical not of the clock 22, i.e., "nclock" 23, is provided to the circuit 28. Referring to the timing diagram of FIG. 7, as circuit 16 is sampling, circuit 28 is converting, and as circuit 16 is converting, circuit 28 is sampling, to provide for continuous conversion.

Figures 7A, 7B:
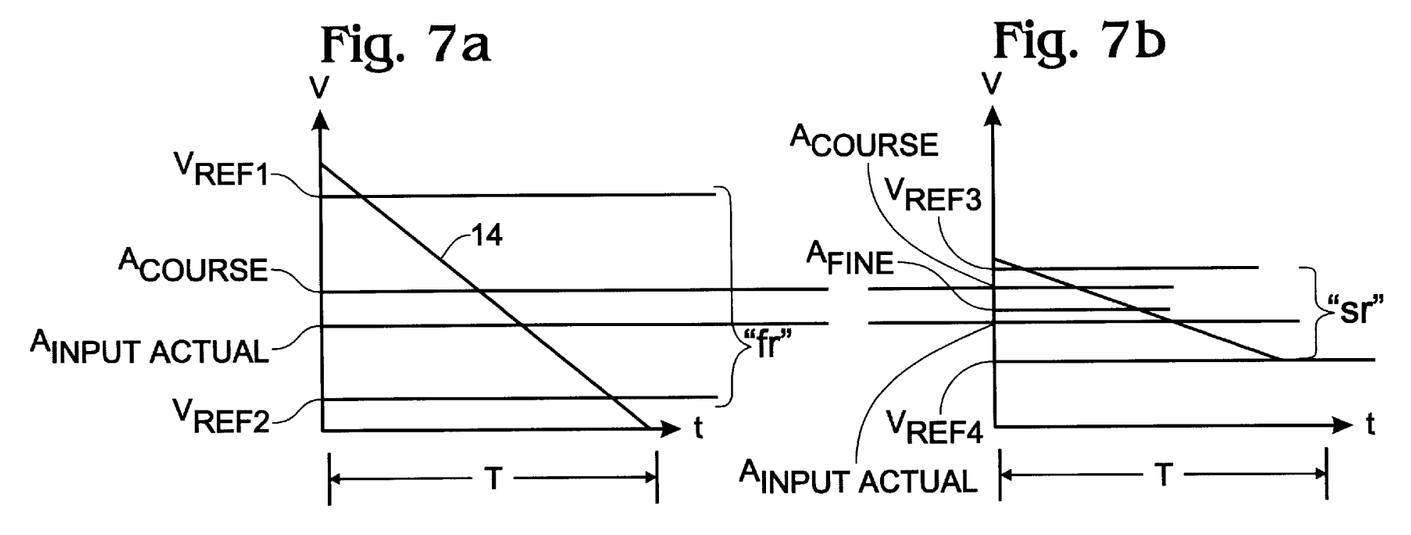
FIG. 7A is a voltage-time plot illustrating a first step of a two-step analog-to-digital conversion method according to the present invention.
FIG. 7B is a voltage-time plot illustrating a second step of a two-step analog-to-digital conversion method according to the present invention.

Turning to FIGS. 7A and 7B, a "two-step" method according to the present invention is illustrated. The just-described additional features may be employed in conjunction with the two-step method; however, for simplicity of illustration, the method will be described as based on the basic, single step method. In a first step of the two-step method, a first set of reference signals $V_{ref1}$ and $V_{ref2}$ are selected to approximately bound the anticipated full range "fr" of $A_{input}$. Where the function describing the scan signal 14 requires more than two coordinates, it remains that two reference signals corresponding to two of the coordinates are selected for bounding the range of $A_{input}$. $A_{input}$ actually has a value $A_{inputactual}$ as shown. The single step method as aforedescribed is carried out for $V_{ref1}$ and $V_{ref2}$ to obtain a "coarse" determination, $A_{coarse}$ of $A_{input}$ which, to some degree of error, approximates $A_{input\ actual}$. That is, the coarse determination, $A_{coarse}$ finds the "p" most significant bits of $A_{input\ actual}$. The remaining "q" least significant bits, where p+q=n, the total resolution, are determined as follows.

With knowledge of $A_{coarse}$, in a second step of the two-step method, a second set of reference signals $V_{ref3}$ and $V_{ref4}$ are selected to bound $A_{coarse}$ over a smaller, "sub"-range "sr." That is, $(V_{ref1} - V_{ref2}) > (V_{ref3} - V_{ref4})$. Preferably, the size of the sub-range is determined from the following considerations. The "q" least significant bits define a part of a digital word that is allowed to have one of $2^q$ possible values. One sub-range "sr" is identifiable for each of these allowable values, bounding the value. There are $2^q - 1$ such sub-ranges for $2^q$ allowable values, wherein each of the sub-ranges has an associated second set of two reference signals $V_{ref3}$ and $V_{ref4}$. Each sub-range spans its associated allowable value on both sides thereof. Each sub-range also extends sufficiently far beyond its associated allowable value to cover the design difference between the allowable value and the actual measurement or determination.

The single step method as aforedescribed is again carried out, by comparing $A_{input}$ and the second set of reference signals to the scan signal 14 appropriate for the particular sub-range. This provides a "fine" determination $A_{fine}$ of $A_{input}$, finding the "q" least significant bits thereof. Because the second set of reference signals are relatively close to the actual value of $A_{input}$, the two step method provides for additional accuracy over the single step method. This can be appreciated qualitatively by noting that the slope of the scan signal over the time interval T is much smaller for the sub-range "sr" than for the full range "fr," as shown in FIGS. 7A and 7B.

Moreover, the two-step method provides for greater speed and efficiency. As mentioned above, the coarse determination requires a resolution "p" and the fine determination requires a resolution "q," where q+p=n, the total resolution. The speed and efficiency of a single step of conversion is inversely proportional to 2 raised to the power of the resolution. However, where the conversion is carried out in steps, the steps are additive. Therefore, in the two-step method, the speed and efficiency are inversely proportional to $(2^q + 2^p)$ rather than the significantly greater number $2^n$.

Figure 8:
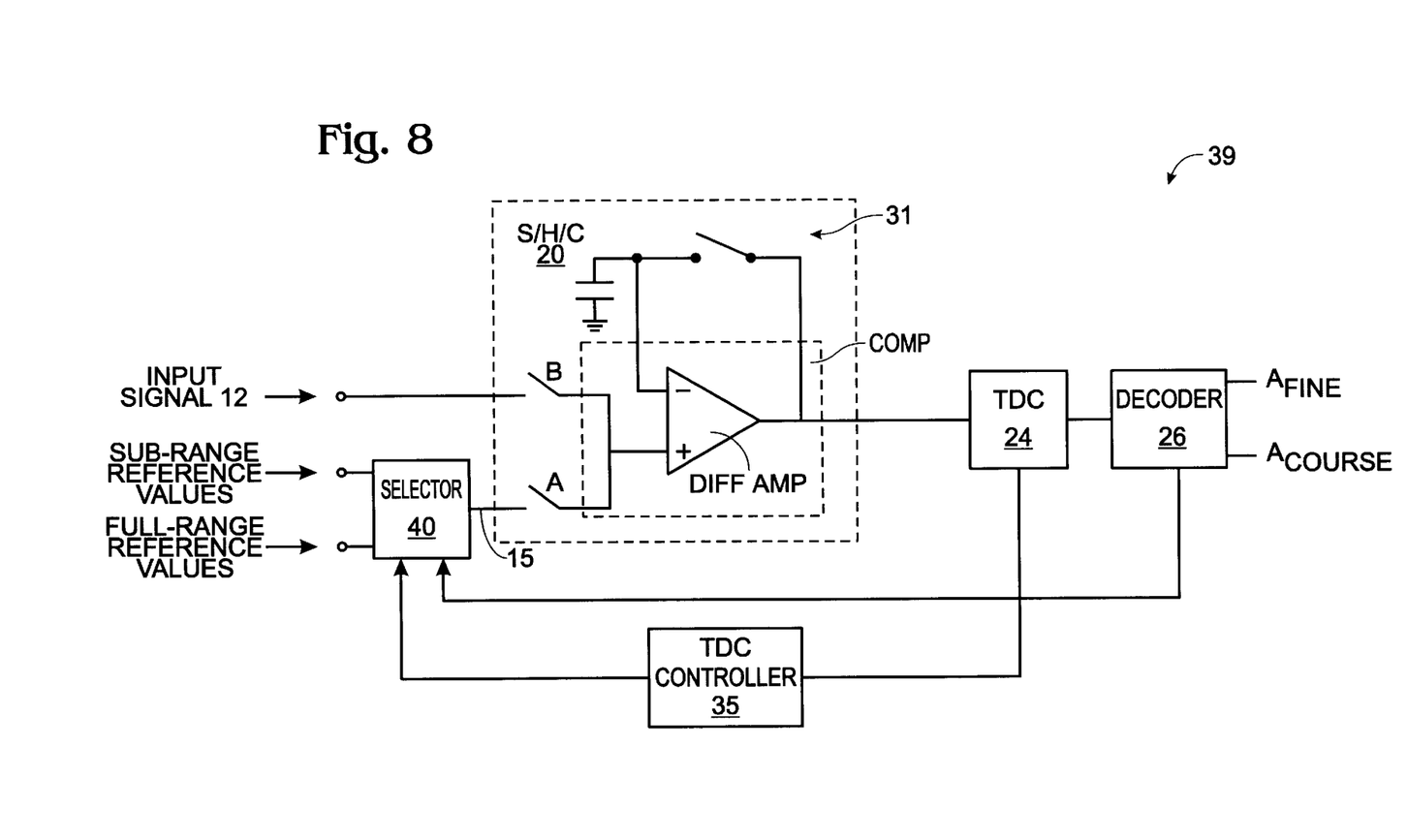
FIG. 8 is a block diagram of a circuit for implementing the two-step conversion of FIGS. 7A and 7B.

FIG. 8 is a block diagram of a circuit 39 for realizing the two-step method as described in connection with FIGS. 7A and 7B. The S/H/C circuit 20 described in connection with the single-step method is shown incorporating the portion 31 of FIG. 2. A selector 40 is provided at the scan signal input 15. Coarse determination is initiated by selecting the reference signals corresponding to the full range. When the time-to-digital conversion for $A_{coarse}$ is complete, the TDC Control 35 sends a signal to the selector to initiate conversion for the fine determination. When the coarse determination is complete, the decoder 26 switches the reference signals to those corresponding to the sub-range.

Figure 9:
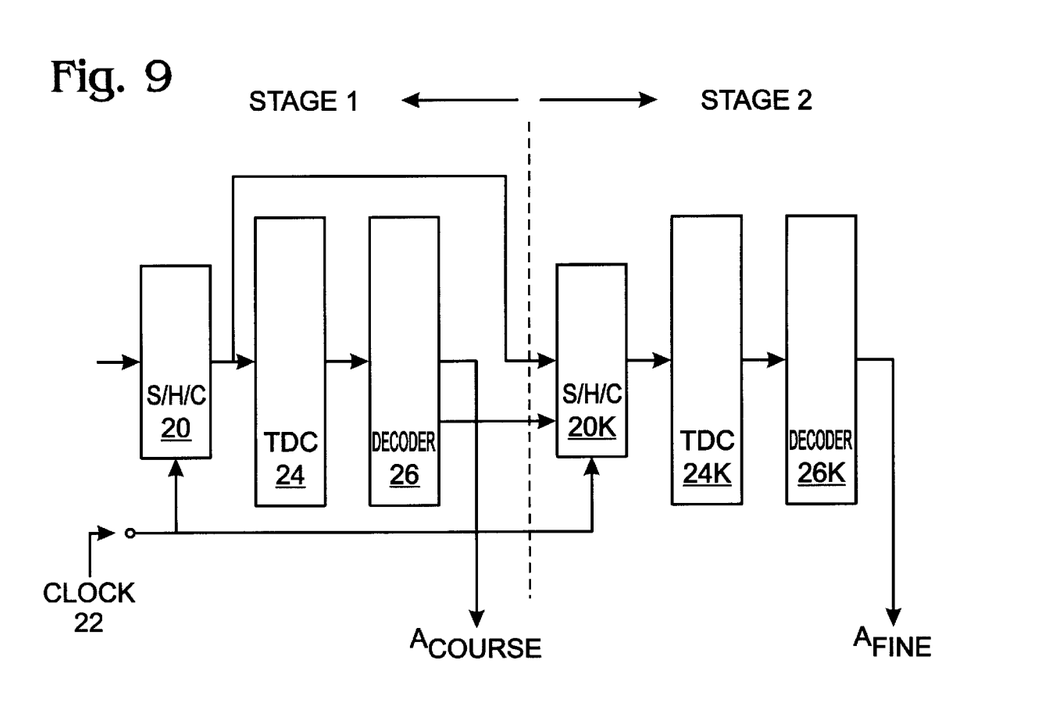
FIG. 9 is a block diagram of a pipelined embodiment of a circuit for carrying out the method of FIGS. 7A and 7B.

FIG. 8 represents a "series" embodiment of the two-step method, wherein a single stage of the circuit 39 is provided and the coarse and fine determinations or conversions are made sequentially as indicated by the feedback loops as described. A faster embodiment of the two-step method, however, provides a pipeline of two stages of the circuit 39. Referring to FIG. 9, in a pipelined embodiment, increased speed is obtained by employing two stages concurrently to process the input signal 12. Then, the first stage may be operating to obtain a coarse determination for a next input signal 12 at the same time that the second stage is operating to obtain the fine determination for the last input signal. In the series embodiment of the method 30, the single stage is occupied until the full n-bits are determined, while in the pipelined embodiment, a single stage is only occupied for the time required to determine the lesser number of bits in either the coarse or fine determinations. A disadvantage of the pipelined embodiment, however, is that there is in general a mismatch between the comparators in the first and second stages.

It is a known problem in the prior art to provide an ADC in digital CMOS that does not suffer from comparator mismatch due to input offset. In the embodiment shown in FIG. 2, both the input signal and the scan signal are provided to the same input of the differential amplifier DiffAmp. Therefore, there is no input offset. However, in an embodiment of the invention where, for example, a sample and hold circuit is provided separately from the comparator circuit, comparator offset again becomes a problem.

Figure 10:
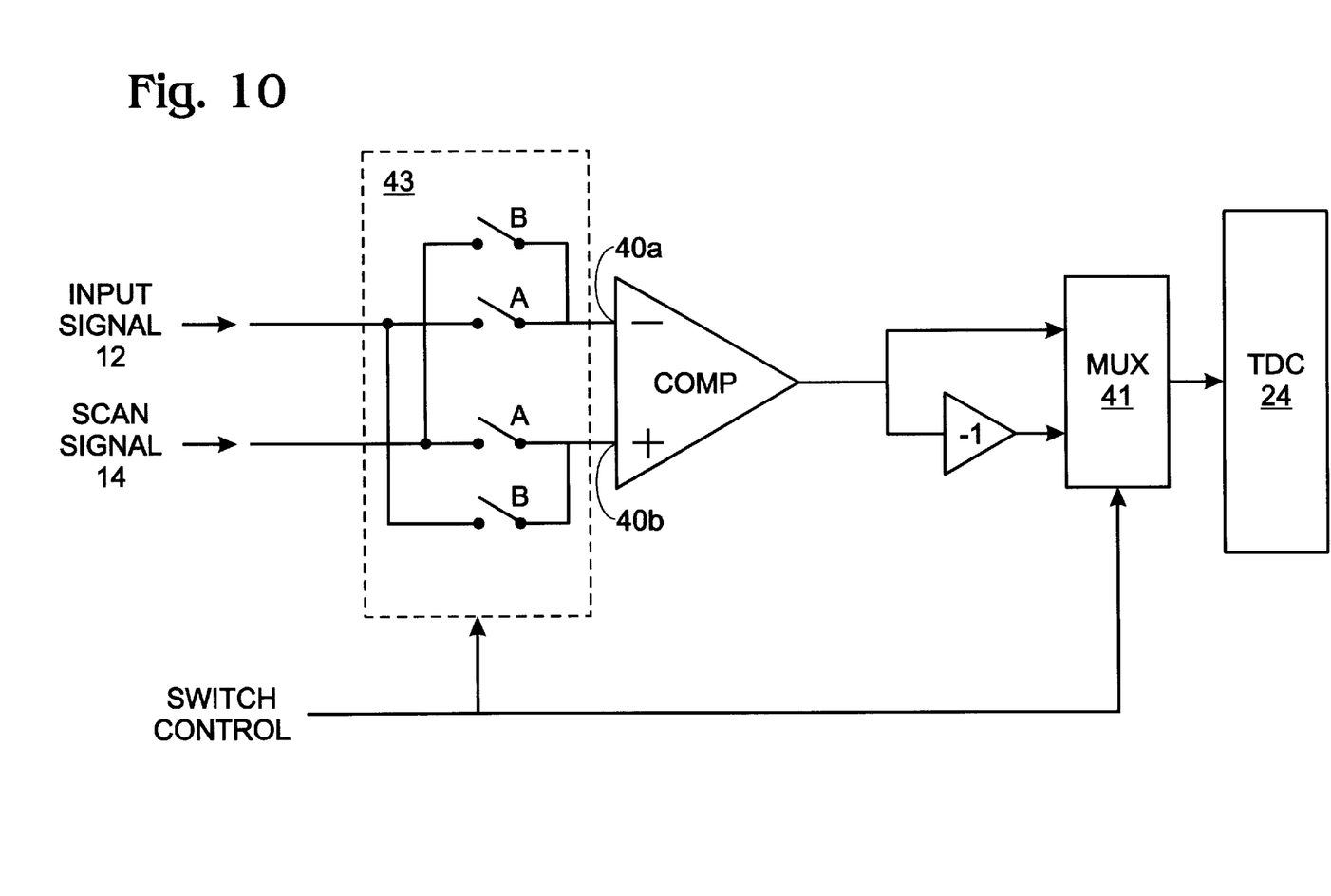
FIG. 10 is a schematic of a circuit implementing a digital averaging method for substantially eliminating comparator offset according to the present invention.
Figure 11:
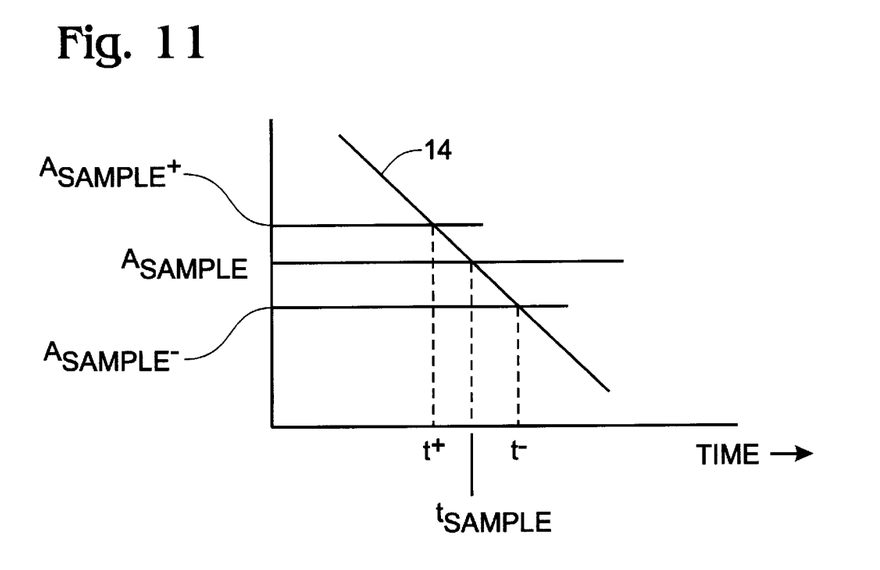
FIG. 11 is a voltage-time plot illustrating the operation of the circuit and method of FIG. 10.

One method for eliminating this offset is to digitally calibrate the comparators and compensate. However, if additional time per conversion can be accepted, substantially eliminating comparator offset may be achieved by digitally averaging. Referring to FIG. 10, a double-pole, double-throw switch 43 controls which of the inputs 40a, 40b are coupled to which of the input signal 12 and the scan signal 14. For example, when the elements "A" are closed and the elements "B" are opened, the input signal is provided to the inverting input 40a of the comparator Comp, and the scan signal is provided to the non-inverting input 40b. Referring in addition to FIG. 11, any of the aforedescribed methods are employed to determine an intermediate digital word $t^+$ representative of the time for the scan signal 14 to reach the value $A_{sample}$. The time $t^+$ represents in error the actual time $t_{sample}$ due to an input offset to the comparator Comp.

At some time, the switch 43 is thrown so that the elements A are opened and the elements B are closed and the inputs 40a and 40b are reversed with respect to the signals 12 and 14 for a second comparison. The comparator output will be reversed; however, multiplexer MUX 41 is provided for selecting between the output and the negated output of the comparator to maintain the state into the TDC 24 for time-to-digital conversion. An intermediate digital word $t^-$ is obtained that represents the value of $A_{sample}$ with an error wherein the comparator input offset has a reversed polarity. The values $t^+$ and $t^-$ are averaged, canceling out even order terms characterizing the input offset.

It is to be recognized that, while particular high accuracy, high speed, low power analog-to-digital conversion methods and circuits according to the present invention have been shown as preferred, other configurations could be utilized, in addition to configurations already mentioned, without departing from the principles of the invention.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims that follow.

We claim:

1. A method for converting an analog signal to a digital signal, comprising:

(a) providing a first reference signal;
(b) providing a second reference signal separated in amplitude from said first reference signal;
(c) providing an analog signal sample;
(d) providing a scan signal whose amplitude is a function of time;
(e) comparing said first reference signal, said second reference signal and said analog signal sample to said scan signal to produce respective intermediate digital words representative of the amplitudes of said reference and analog signals; and
(f) normalizing the intermediate digital word representative of the amplitude of said signal sample, based on the intermediate digital words representative of the respective amplitudes of said reference signals and on said function of time, to produce a normalized digital word representative of the amplitude of said analog signal sample relative to said reference signals.

2. The method of claim 1, wherein said comparing step comprises establishing, as an initial condition, a start time for said scan signal after which said scan signal varies with time in a predetermined manner, determining the time elapsing since said start time when said scan signal substantially equals said analog signal sample, determining the time elapsing since said start time when said scan signal substantially equals said first reference signal, and determining the time elapsing since said start time when said scan signal substantially equals said second reference signal, wherein said intermediate digital words represent said elapsed times.

3. The method of claim 1, wherein said normalizing step comprises establishing a representation of said function of time based on said intermediate digital words representative of the respective amplitudes of said reference signals, and the amplitude of said analog signal sample, and calculating a normalized digital word based on said intermediate digital words.

4. The method of claim 2, wherein said normalizing step comprises establishing a representation of said function of time based on said intermediate digital words representative of the respective amplitudes of said reference signals, and the amplitude of said analog signal sample, and calculating a normalized digital word based on said intermediate digital words.

5. The method of claim 1, further comprising providing a plurality of analog signal samples, comparing said plurality of analog signal samples to said scan signal to produce a plurality of intermediate digital words representative of the respective amplitudes of said plurality of analog signal samples, and normalizing said plurality of intermediate digital words representative of the amplitudes of said plurality of analog signal samples to produce a corresponding plurality of normalized words based on said intermediate digital words representative of the respective amplitudes of said reference signals and on said function of time.

6. The method of claim 5, wherein said function of time is linear.

7. The method of claim 1, wherein said function of time is linear and said normalizing step comprises using said intermediate digital words representative of the respective amplitudes of said reference signals to establish the slope and intercept of said linear function of time, and calculating said normalized digital word representative of the amplitude of said analog signal sample based on said intermediated digital word representative of the amplitude of said analog signal sample and on the slope and said intercept.

8. The method of claim 1, further comprising adjusting said first reference signal and said second reference signal so as to reduce their amplitude separation, and repeating said comparing and normalizing steps for said input analog signal sample to obtain a higher resolution normalized digital word representative of the amplitude of said analog signal sample.

9. The method of claim 1, wherein said comparing step includes providing a comparator for comparing said analog signal sample to said scan signal, wherein said comparator includes an inverting and a non-inverting input, and wherein, during a first time period, said analog signal sample is provided to one of said inverting and said non-inverting inputs and said scan signal is provided to the other of said inverting and said non-inverting inputs and, during a second time period, said analog signal is provided to the other of said inverting and said non-inverting inputs and said scan signal is provided to said one of said inverting and said non-inverting inputs, to substantially cancel the input offset error of said comparator.

10. The method of claim 1, wherein, during a first time period, the analog signal is sampled multiple times to obtain a first plurality of analog signal samples and, during a second time period, steps (a)–(f) are applied to said first plurality of analog signal samples.

11. The method of claim 10, wherein, during said first time period, steps (a)–(f) are applied to a previously obtained plurality of analog signal samples and, during said second time period, the analog signal is sampled multiple times to obtain a second plurality of analog signal samples.

12. The method of claim 10 wherein said additional analog signal samples are obtained sequentially in time.

13. The method of claim 10, wherein said first time period and said second time period are substantially equal in duration.

14. An analog-to-digital converter, comprising:
a first reference signal input;
a second reference signal input;
an analog signal sample input;
a scan signal input for receiving a scan signal whose amplitude varies as a function of time;
a comparison circuit for producing intermediate digital words representative of the respective amplitudes of signals applied to said first reference signal input, said second reference signal input and said analog signal sample input; and
a normalizing circuit for producing a normalized digital word representative of the amplitude of a signal applied to said analog signal sample input based on said intermediate digital words representative of the respective amplitudes of the signals applied to said analog signal sample input and said reference signal inputs and on said function of time.

15. The analog-to-digital converter of claim 14, wherein said comparison circuit comprises a timing circuit establishing a start time for a signal applied to said scan signal input, the elapsed time since said start time when the amplitude of the signal applied to said scan signal input substantially equals the amplitude of the signal applied to said analog sample input, the elapsed time since said start time when the amplitude of the signal applied to said scan signal input substantially equals the amplitude of the signal applied to said first reference signal input, and the elapsed time since said start time when the amplitude of the signal applied to said scan signal input substantially equals the amplitude of the signal applied to said second reference signal input, and a time-to-digital conversion circuit for converting said elapsed times to said intermediate digital words.

16. The analog-to-digital converter of claim 14, wherein said normalizing circuit comprises a circuit for establishing a digital representation of said function of time based on said intermediate digital words representative of the amplitudes of the signals applied to said reference signal inputs, and for calculating said normalized digital word based on said intermediate digital words.

17. The analog-to-digital converter of claim 15, wherein said normalizing circuit comprises a circuit for establishing a digital representation of said function of time based on said intermediate digital words representative of the amplitudes of the signals applied to said reference signal inputs, and for calculating said normalized digital word based on said intermediate digital words.

18. The analog-to-digital converter of claim 17, further comprising a plurality of analog signal inputs and a plurality of respective comparators for comparing the amplitudes of the plurality of signals applied, respectively, to said plurality of analog signal inputs to the amplitude of the signal applied to said scan signal input to produce respective intermediate digital words representative of the respective amplitudes of the plurality of signals applied to said plurality of analog signal inputs, said normalizing circuit normalizing said plurality of intermediate digital words representative of the respective amplitudes of the plurality of signals applied to said plurality of analog signal inputs based on said intermediate digital words representative of the respective amplitudes of the signals applied to said reference signal inputs and on said function of time.

19. The analog-to-digital converter of claim 18, wherein said function of time is linear.

20. The analog-to-digital converter of claim 14, wherein said function of time is linear, and said normalizing circuit comprises a circuit for using said intermediate digital words representative of the reference signals applied to said reference signal inputs to establish the slope and intercept of said linear function of time, and calculating said normalized digital word based on said intermediate digital word representative of the amplitude of the signal applied to said analog signal input and on said slope and said intercept.

21. The analog-to-digital converter of claim 14, wherein said comparison circuit comprises a differential amplifier having a first differential input for connection, alternatively, to said analog signal input or said scan signal input, and a second differential input connected to a charge storage device, and a differential output, said second differential input being selectively connectable to said differential output, so that when said first differential input is connected to said analog signal input and said second differential input is connected to said differential output the amplitude of the signal applied to said analog signal input is stored on said charge storage device, and when said first differential input is connected to said scan signal input and said second differential input is disconnected from said differential output, the amplitude of the signal stored on said charge storage device is compared to the amplitude of the signal applied to said scan signal input.

22. The analog-to-digital converter of claim 14, further comprising a control circuit for supplying the first reference signal to said first reference signal input, the second reference signal to said second reference signal input, and the scan signal to said scan signal input, wherein the second reference signal is separated in amplitude from the first reference signal, and, wherein, after a first comparison is made, said control circuit changes the amplitude of the first reference signal and the amplitude of the second reference signal so that their separation is decreased and causes a second comparison to occur to obtain a higher resolution normalized digital word representative of the amplitude of the input analog signal.

23. The analog-to-digital converter of claim 14, wherein said comparison circuit includes an inverting input and a non-inverting input, wherein a switch is provided to control access to one of said inverting and said non-inverting inputs, and wherein the signal applied to said scan signal input and the signal applied to said analog signal sample input are alternatively coupled to said one of said inverting and said non-inverting inputs by said switch, to substantially cancel the input offset of said comparison circuit.

24. The analog-to-digital converter of claim 14, wherein said comparison circuit for producing said intermediate digital words during a first time period, wherein said normalizing circuit for producing said normalized digital word during a second time period that is separate from said first time period, wherein said comparison circuit for producing a plurality of intermediate digital words representative of the respective amplitudes of a plurality of analog signal samples applied to said analog signal sample input sequentially in time during said first time period and provide said plurality of intermediate digital words to said normalizing circuit, and wherein said normalizing circuit for producing a plurality of normalized digital words representative of the amplitudes of the plurality of analog signal samples applied to said analog signal sample input based on said intermediate digital words representative of the respective amplitudes of the plurality of analog signal samples applied to said analog signal sample input and the reference signals applied to said reference signal inputs during said second time period.

25. The analog-to-digital converter of claim 24, wherein said first time period and said second time period are substantially equal in duration.

26. An analog-to-digital converter, comprising:
- a scan signal generator for producing a scan signal whose amplitude varies with time in a predetermined manner;
- a plurality of charge storage devices, each having an input for receiving and storing a charge representative of the amplitude of one of a plurality of respective source signals to be converted from analog to digital form;
- a plurality of source signal comparators, each having a first input for connection to a respective charge storage device, a second input for receiving said scan signal, and an output whose state indicates whether the signal applied to said first input is higher or lower than the signal applied to said second input;
- a high reference signal comparator having a first input for connection to a high reference signal, a second input for receiving said scan signal, and an output whose state indicates whether said high reference signal is higher or lower than said scan signal,
- a low reference signal comparator having a first input of connection to a low reference signal, a second input for receiving said scan signal, and an output whose state indicates whether said low reference signal is higher or lower than said scan signal;
- a plurality of time-to-digital converters connected to respective outputs of said comparators for producing respective intermediate digital words representative of the time said respective comparator is in a given state; and
- a computation circuit responsive to said intermediate digital words produced by said time-to-digital converters for producing normalized digital words representative of the respective amplitudes of said source signals relative to said high and low reference signals.

27. The analog-to-digital converter of claim 26, further comprising a second plurality of charge storage devices, a corresponding second plurality of signal source capacitors, a corresponding second plurality of time-to-digital converters, a second high reference signal capacitor, a second low reference signal capacitor, and a control circuit for causing said second plurality of time-to-digital converters to operate while said first plurality of charge storage devices operates and said first plurality of time-to-digital converters to operate while said second plurality of charge storage devices operate.

* * * * *